United States Patent [19]

Salomon et al.

[11] Patent Number: 4,866,030
[45] Date of Patent: Sep. 12, 1989

[54] METHOD OF PRODUCING HIGH TEMPERATURE SUPERCONDUCTORS BY A MOLTEN HYDROXIDE PROCESS

[75] Inventors: Robert E. Salomon, Philadelphia; Jack E. Crow, Berwyn; Edward Kaczanowicz, Fort Washington, all of Pa.

[73] Assignee: Temple University-of the Commonwealth System of Higher Education, Philadelphia, Pa.

[21] Appl. No.: 83,549

[22] Filed: Aug. 6, 1987

[51] Int. Cl.$^4$ .................... H01L 39/12; C01G 03/02; C01F 17/00; C04B 35/60
[52] U.S. Cl. ........................................ 505/1; 423/263; 423/593; 423/604; 501/152; 501/126; 505/809; 505/810; 505/815
[58] Field of Search ....................... 423/604, 593, 263; 501/152, 126; 252/518, 521

[56] References Cited

U.S. PATENT DOCUMENTS

| | | | |
|---|---|---|---|
| 2,474,497 | 6/1949 | Rowe | 423/604 |
| 2,536,096 | 1/1951 | Rowe | 423/604 |
| 3,833,717 | 9/1974 | Haskett et al. | 423/604 |
| 4,132,569 | 1/1979 | De Pablo et al. | 423/491 |
| 4,293,534 | 10/1981 | Arendt | 423/593 |
| 4,374,117 | 2/1983 | Arendt | 423/593 |
| 4,643,984 | 2/1987 | Abe et al. | 423/593 |

FOREIGN PATENT DOCUMENTS 135477  5/1979  German Democratic Rep.

OTHER PUBLICATIONS

*Ceramic Processing Before Firing*, Edited by Onoda and Hench (N.Y., NY, 1978), pp. 131–139.
"A Hydroxycarbonate Route to Superconducting Precursor Powders", Voight et al., MRS Symposium Proceedings, vol. 99, Dec. 1987, pp. 635–638.
"Manufacture and Testing of High-Tc Superconducting Materials", Yarar et al., Advanced Ceramic Materials, vol. 2, No. 3B Special Issue, Jul. 1987.
Capone, et al., "Upper Critical Fields and High Superconducting Transition Temperatures of $La_{1.85}Sr_{0.15}CuO_4$ and $La_{1.85}Ba_{0.15}CuO_4$" (U.S. Dept. of Energy sponsored work), submitted to Applied Physics Letters, 1/87.
Liu, et al., "Superconductivity and Structure of Single Crystal $YBa_2Cu_3O_4$," submitted to Physics Letters A, 3/30/87, p. 2.
Hinks, et al., "Phase Diagram and Superconductivity in the Y–Ba–Cu–O System," submitted to Appl. Phys. Lett., 3/18/87, p. 2.
Beyers, et al., "Annealing Treatment Effects on Structure and Superconductivity in $Y_1Ba_2Cu_3O_{9-x}$" submitted to Applied Phisics Letters, p. 2.
Gallagher, et al., "Identification and Preparation of Single Phase 90K Oxide Superconductor and Structural Determination by Lattice Imaging", submitted to Solid State Communications, 3/17/87, p. 3.
Schirber, et al., "Variation of the Pressure Dependence of the Superconducting Transition Temperature with x in $La_{1-x}Sr_xCuO_4$".
Kwok, et al., "Normal and Superconducting State Properties of $La_{1.85}Sr_{0.15}CuO_4$", submitted to Phys. Rev. Lett., 1/87.
Capone, et al., "Upper Critical Fields and High Superconducting Transition Temperatures of $La_{1.85}Sr_{0.15}CuO_4$ and $La_{1.85}Ba_{0.15}CuO_4$", p. 2.

(List continued on next page.)

Primary Examiner—Paul Lieberman
Attorney, Agent, or Firm—Seidel, Gorda, Lavorgna, Monaco

[57] ABSTRACT

The present invention is directed to a method of producing metal oxides which are useful as high temperature superconductors. The method comprises the steps of:
(a) mixing generally stoichiometric amounts of metal compounds with an alkali metal metal hydroxide, thereby forming a mixture;
(b) heating the mixture to drive off water; and
(c) filtering the mixture to remove the alkali metal ions.

6 Claims, 1 Drawing Sheet

OTHER PUBLICATIONS

Jorgensen, et al., "Lattice Instability and High-Te Superconductivity in $La_{2-x}Ba_xCuO_4$", submitted to Physical Review Letters, 1/87, p. 3.

Hawley, et al., "Energy Gap in $La_{1.85}Sr_{0.15}CuO_{4-y}$ From Point-Contact Tunnelling", submitted to Phys. Rev. Lett., p. 2.

Chu, et al., "Evidence for Superconductivity above 40K in the La–Ba–Cu–O Compound System", Physical Review Letters, vol. 58, No. 4, 1/26/87, pp. 405–407.

Maranto, "Superconductivity: Hype vs. Reality", Discover Magazine, 8/87, pp. 22–32.

Fisher, "Superconductor Frenzy", *Popular Science Magazine*, 7/87, pp. 54–58, 97.

Schirber, et al., "Pressure Dependence of the Superconducting Transition Temperature in the 94K Superconductor, $YBa_2Cu_3O_7$", submitted to Phys. Rev.

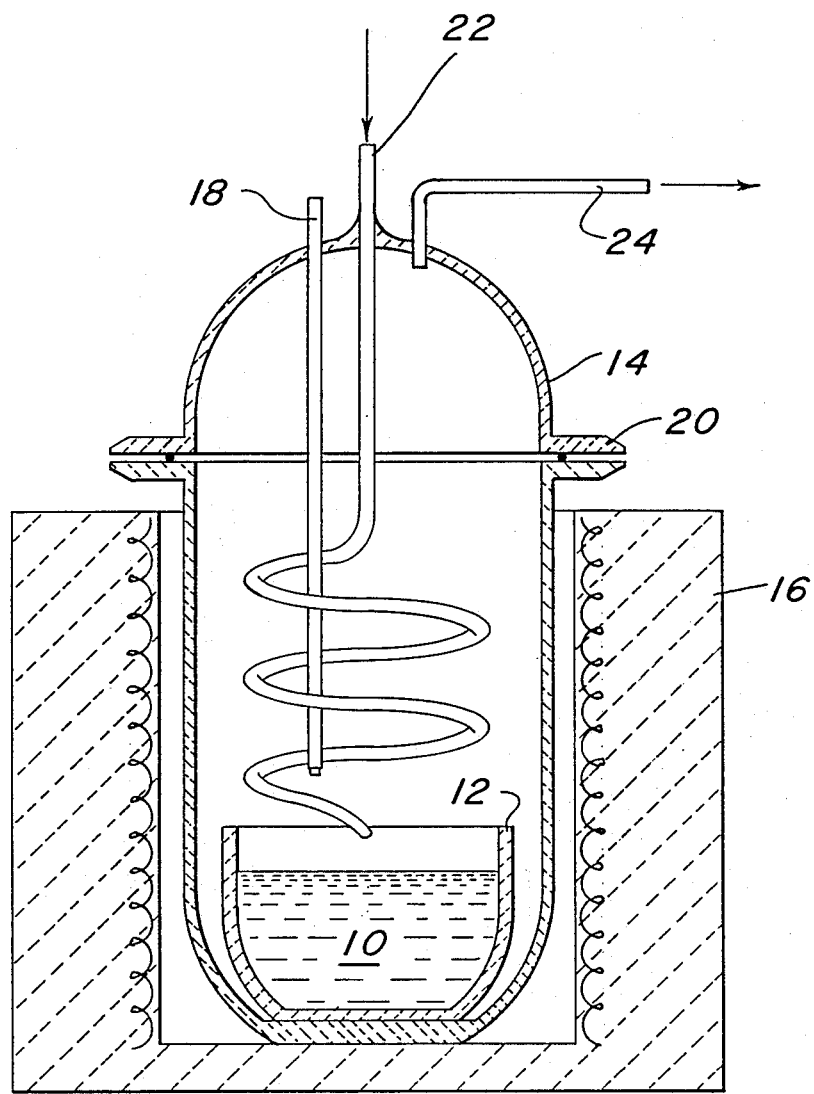

METHOD OF PRODUCING HIGH TEMPERATURE SUPERCONDUCTORS BY A MOLTEN HYDROXIDE PROCESS

SCOPE OF THE INVENTION

The present invention is directed to a molten hydroxide process for preparing metal oxides which are used as high temperature superconductors.

BACKGROUND OF THE INVENTION

Recently, researchers have discovered ternary metal oxides, such as $YBa_2Cu_3O_7$, which exhibit virtually no electrical resistance at relatively high temperatures of approximately 93° Kelvin. Other researchers have proposed other metal oxide compounds which also exhibit the characteristics of a "superconductor", for example $MBa_2Cu_3O_7$, where M is one of the elements of the rare earth series.

These superconducting compounds are produced for laboratory analysis by: mixing the oxide forms of the metals together; pressing the mixture into a pellet; sintering the pellet at a temperature of about 1,000°; grinding the sintered pellet, then repeating the mixing, pressing and sintering steps. After the compound is formed, it is oxygen annealed. However, this method is not considered industrially viable because the sintered mixture is extremely hard and abrades the grinding apparatus thereby introducing impurities into the superconducting compound and the method is labor intensive.

Alternately, a co-precipitation method has been proposed. In the co-precipitation method, the nitrates of the metal components are mixed, in solution, and co-precipitation is initiated by using a material, such as sodium carbonate. The co-precipitate is then heated overnight thereby forming the superconducting compound. This method is plagued with problems of non-uniform precipitation of the product and contamination of the product by the precipitating agents.

Accordingly, there is a need for a simple and inexpensive method of producing superconducting metal oxide compounds.

SUMMARY OF THE INVENTION

The present invention is directed to a method of producing metal oxides which are useful as high temperature superconductors. The method comprises the steps of:

(a) mixing generally stoichiometric amounts of metal compounds with an alkali metal hydroxide, thereby forming a mixture;

(b) heating the mixture to drive off water; and (c) filtering the mixture to remove the alkali metal ions.

The present invention provides a novel and non-obvious method of producing metal oxides useful as high temperature superconductors which is industrially viable. The product of the method is a homogeneous, fine grain metal oxide powder which may be further processed into high temperature superconductor devices.

Moreover, X-ray diffraction analysis and other studies of the metal oxide, before annealing, indicates that the powders are nearly homogeneous.

Furthermore, the method described herein is not labor intensive as the previously described methods and hence can be readily commercialized.

Additionally, the particle size of the metal oxide formed by the present method can be controlled by varying the time/temperature profiles and the relative amount of the reactants. This is preferred for fabrication and subsequent oxygen treatment.

DESCRIPTION OF THE DRAWING

For the purpose of illustrating the invention, there is shown in the drawings a form which is presently preferred; it being understood, however, that this invention is not limited to the precise arrangements and instrumentalities shown.

FIG. 1 is a schematic illustration of the experimental apparatus used for performing the disclosed method.

DETAILED DESCRIPTION OF THE INVENTION

The present method is described with reference to the superconducting metal oxide, $YBa_2Cu_3O_7$, however, this method is not limited to that particular compound. For example, lanthanum (La) or a combination of rare earth compounds may be substituted for yttrium (Y). The following are proposed chemical equations for the reaction, however these equations are merely theoretical and are not binding on the present invention. The exact amount of oxygen in the product is unknown, however the oxygen coefficient is assumed to be 6.5 to preserve the normal valence among the elements. The first equation is an ionic equation and the second equation represents one embodiment (nitrate compounds) of the present invention.

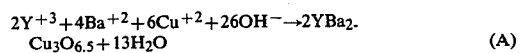

$$2Y^{+3} + 4Ba^{+2} + 6Cu^{+2} + 26OH^- \rightarrow 2YBa_2Cu_3O_{6.5} + 13H_2O \quad (A)$$

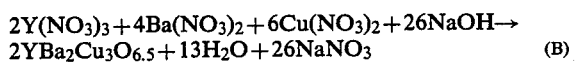

$$2Y(NO_3)_3 + 4Ba(NO_3)_2 + 6Cu(NO_3)_2 + 26NaOH \rightarrow 2YBa_2Cu_3O_{6.5} + 13H_2O + 26NaNO_3 \quad (B)$$

Referring to FIG. 1; the present invention is described as follows:

The method begins by mixing roughly stoichiometric amounts of Y, Ba, and Cu compounds, which are soluble in hydroxides (e.g. nitrates and oxides) with an alkali metal hydroxide. The compounds can be provided with or without the water of hydration. The alkali metal hydroxide preferably refers to sodium hydroxide, potassium hydroxide or an appropriate eutectic mixture of sodium and potassium hydroxide (e.g. 50-50 eutectic mixture), in solid form. For example, in a representative formulation, about 0.01 moles of each of the compounds is mixed with 25 grams of the hydroxide. It has been found that by increasing the amount of the Ba compound to above the stoichiometric amount, that the desired product $YBa_2Cu_3O_7$ is favored over $Y_2BaCuO_7$.

The metal compounds and the hydroxide are placed in a crucible 12. Nickel is the preferred material of construction for the crucible when a pure hydroxide is used because it can withstand the corrosive action of the molten hydroxide. However, if the eutectic combination of hydroxides is used, a polytetrafluoroethylene (Teflon ®) crucible may be used because the melting temperature of the eutectic mixture is below the decomposition temperature of the Teflon ® crucible.

The filled crucible 12 is placed in a sealed vessel 14, having an O-ring joint 20, preferably made of either vycor or stainless steel, and slowly heated in an oven 16 to a temperature sufficient to melt the hydroxide (about 400° C. in the case of pure sodium hydroxide or above 171° C. for the eutectic composition of the hydroxides). The temperature is conventionally measured by any device, such as a thermocouple 18. Preferably, the temperature can be between the melting temperature of the hydroxide and below the decomposition temperature of the compounds. Preferably, the heating step takes about two hours, but should be for a period of time sufficient to drive off most or all water from the reaction.

During the heating step, a dry gas is passed through the vessel 14 to facilitate removal of the water vapor liberated from the reaction mixture. The dry gas is preferably nitrogen, however air or other gas may be used. Oxygen, itself, may be advantageously used. Preferably, the dry gas is introduced into vessel 14 adjacent the surface of the molten reaction mixture 10 via an inlet 22. The spent gas is exhausted via outlet 24. Alternatively, the vessel may be evacuated (not shown) to remove the water vapor. Evacuation may be accomplished by a liquid nitrogen trapped pump. Evacuation, however, is not preferred because of the inevitable splattering of the molten material, due to lower internal vessel pressure.

After the heating step, the metal oxide, a powdery black product, is filtered from the molten material. Preferably, the molten mixture is cooled to about 150° C. and the crucible is placed in an excess of water (approximately 1 liter of distilled water is used for the amounts of reactants described above). The hydroxide dissolves into the water thereby liberating the metal oxides (powdery black product). After all the hydroxide has dissolved, the solution containing the metal hydroxide is preferably filtered under vacuum in a Beuchner funnel. The metal oxide is washed and refiltered to remove any residual alkali metal ions. The final wash is complete when the filtrate's pH is approximately neutral. Thereafter, the filter paper and product are dried at about 140° C. The product is easily removed, by scraping, from the filter paper after drying.

Alternatively, the metal oxide can be filtered directly from the molten material without cooling. The molten material is maintained at a temperature in excess of the melting point of the hydroxide and is filtered through a porous nickel filter.

After filtering the metal oxide is oxygen annealed, as is well known in the art.

The metal oxide obtained using the eutectic composition of hydroxide exhibits high temperatures superconductivity, but the transition temperatures (Tc) are somewhat lower.

The particle size can be controlled by varying the temperature/time profiles and the relative amounts of the reactants.

The present invention may be embodied in other specific forms without departing from the spirit or essential attributes thereof and, accordingly, reference should be made to the appended claims, rather than to the foregoing specification, as indicating the scope of the invention.

We claim:

1. A method for producing high temperature superconductors by a molten hydroxide process comprising the steps of:
   (a) mixing stoichiometric amounts of metal compounds, one metal of said metal compounds being selected from the group consisting of rare earth elements or combinations of rare earth elements, with a solid alkali metal hydroxide, thereby forming a mixture;
   (b) melting the alkali metal hydroxide of the mixture to drive off water; and
   (c) filtering the mixture to remove the alkali metal ions.

2. A method of producing high temperature superconductors by a molten hydroxide process comprising the steps of:
   (a) mixing stoichiometric amounts of metal compounds, one metal of said metal compounds being selected from the group consisting of rare earth elements or combinations of rare earth elements and another metal of said metal compounds being copper, with a solid alkali metal hydroxide selected from the group consisting of NaOH or KOH or a combination of the two, thereby forming a mixture;
   (b) heating the mixture to a temperature above the melting temperature of the alkali metal hydroxide but below the decomposition temperature of the metal compounds to drive off water; and
   (c) filtering the mixture to remove the alkali metal ions.

3. The method according to claim 1 wherein the mixture is melted at a temperature at or above the melting temperature of the metal hydroxide and below the decomposition temperature of the metal compounds.

4. The method according to claims 1 or 2 wherein filtering further comprises cooling the mixture to about 150° C., placing the cooled mixture in a quantity of distilled water sufficient to extract the metal hydroxide from the mixture, thereby forming a solution; filtering the solution whereby the metal hydroxide is separated from the filtrate; and washing the metal oxide until the filtrate has a substantially neutral pH.

5. The method according to claims 1 or 2 wherein filtering comprises filtering the mixture at a temperature in excess of the melting point of the metal hydroxide.

6. The method according to claims 1 or 2 further comprising annealing the product of the filtering step in oxygen.

* * * * *